United States Patent [19]

Hall

[11] Patent Number: 4,995,157

[45] Date of Patent: Feb. 26, 1991

[54] COMPONENT FEEDER SYSTEM

[75] Inventor: Douglas R. Hall, Indianapolis, Ind.

[73] Assignee: Reel-Tech Inc.

[21] Appl. No.: 352,750

[22] Filed: May 16, 1989

[51] Int. Cl.⁵ .............................................. H05K 3/30
[52] U.S. Cl. ..................................... 29/740; 29/759;
29/834; 198/385; 198/390; 198/399
[58] Field of Search .......... 29/740, 741, 759, 834–836;
198/385, 389, 390, 399, 396

[56] References Cited

U.S. PATENT DOCUMENTS

| | | | |
|---|---|---|---|
| 4,122,975 | 10/1978 | Lowery et al. | 198/389 |
| 4,458,412 | 7/1984 | Denn et al. | |
| 4,459,743 | 7/1984 | Watanabe et al. | |
| 4,551,913 | 11/1985 | Campisi | 29/740 |
| 4,754,545 | 7/1988 | Elliott | |
| 4,809,839 | 3/1989 | Elliott | 29/749 X |

FOREIGN PATENT DOCUMENTS 2076709 12/1981 United Kingdom .

OTHER PUBLICATIONS

"Cooperative Efforts . . . "; Kubo; IEE; Feb., 1981; vol. 18, No. 170, pp. 73–76.

Primary Examiner—Carl E. Hall

[57] ABSTRACT

A chip component handling and loading system for orienting and transporting a plurality of generally rectangular chip components includes a storage and feed location which, by means of vibratory action, randomly shakes out the chip components into or onto a series of twenty-five substantially parallel, generally rectangular channels. These channels are sized and arranged to receive the chip components in only one proper orientation. Any chip component which is not properly oriented either will not fit in the channel, or will fit in the channel as to its width and not height and downstream from the entry into the channels is a brush-back station where any improperly oriented chip component is either brushed away from the top surface of the channels or is brushed into a proper orientation. The channel dimensions represent the most likely orientation for the randomly vibrated chip components though not the necessary orientation for electrical testing of the components and loading these components into the clear plastic strip which will ultimately be used by the circuit board manufacturer. Consequently, a roll-over insert block is provided so as to transform the orientation of the chip components as initially loaded into the channels into a different orientation which corresponds to that required for electrical testing and component loading.

20 Claims, 5 Drawing Sheets

COMPONENT FEEDER SYSTEM

BACKGROUND OF THE INVENTION

The present invention relates in general to component handling machines and in particular to high-volume machines for loading surface mount chip components into plastic strip tape for use by circuit board manufacturers as part of any automatic or manual component loading operation.

In 1977 the first chip components made their debut and since then remarkable progress has been made in the introduction of chip components into TV tuners, VTR's, cameras and a wide variety of other consumer and industrial products. As the number of different chip components has increased, so has the variety of the equipment and techniques for handling and mounting these chip components onto printed circuit boards.

One concern though is the speed at which the chip components may be installed on the circuit boards. Another concern which impacts on the first concern is the location where the chip components are sorted, arranged and tested. These activities may be conducted at the site where the printed circuit boards are fabricated or may be performed off-site and then brought to the point of fabrication already tested and in a packaging configuration suitable for use by the printed circuit board manufacturer. When the sorting, arranging and testing is done off-site, a means must be provided for safely transporting the chip components to the location of fabrication.

One means for such safe handling and transporting is to load the chip components into a plastic strip or tape wherein the component is actually sandwiched between two layers of plastic and the resultant encased series of components in strip form is rolled onto a spool or reel so that the loaded components can be easily retrieved as part of an automated assembly procedure. The style of tape strip which is typically used includes a lower panel with formed or drawn receiving depressions and a top panel which is sealed to the lower panel. The depressions in the lower strip of plastic are sized and shaped so as to match the size and shape of the particular chip components. Whether the components are shaped as a rectangular solid, cube or cylinder, the depressions are configured so that the components fit comfortably in the depressions, below the upper surface of this lower plastic strip so that the top closing panel may simply be a flat strip of plastic. It is important for the top closing strip to be sealed to the lower strip either by means of a heat-sealing technique or adhesive so that handling is facilitated and so that environmental contaminants will not affect the chip components which are encased within this plastic strip.

A very popular component for thick-film and thin-film hybrid circuit boards are surface-mount chips, such as ceramic capacitors, which are typically rectangular in shape on each face. Since rectangular solid chip components can conceivably orient themselves on one of three different faces (two faces of each size), some type of sorting and handling machine is needed in order to get each chip component properly oriented from a bulk supply into the necessary orientation for placement into the various depressions in the lower plastic strip of the continuous plastic tape.

The present invention provides a suitable sorting and handling machine which is uniquely styled in order to provide extremely high volume handling and loading of the chip components into the plastic tape. The present invention uses the inherent orienting tendencies of the chip components and a helix or spiral track to turn the chip components 90 degrees from their initial orientation in the machine to their final orientation for loading into the tape strip.

SUMMARY OF THE INVENTION

A chip component handling and loading system for orienting and transporting a plurality of generally rectangular chip components according to one embodiment of the present invention comprises dispensing means for storing and delivering a plurality of randomly oriented chip components, a plurality of substantially parallel component conveying tracks disposed in cooperating communication with the dispensing means, a roll-over block having a plurality of receiving channels which are disposed in cooperative communication with the plurality of conveying tracks, the plurality of receiving channels each having a spiral twist and pick and place means for concurrently transferring a plurality of chip components from the plurality of receiving channels to another location.

One object of the present invention is to provide an improved chip component handling and loading system.

Related objects and advantages of the present invention will be apparent from the following description.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 1:
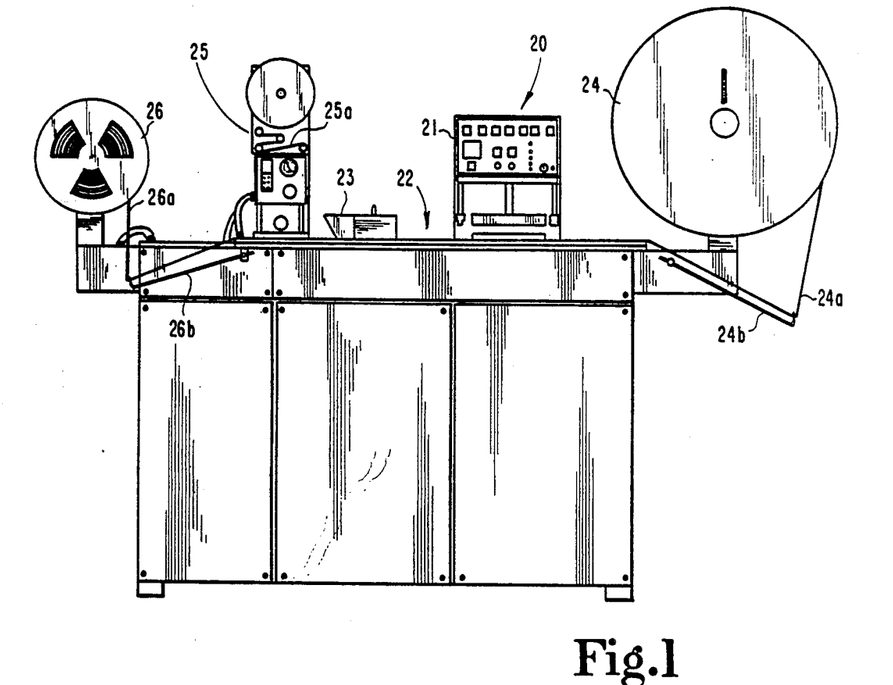
FIG. 1 is a front elevational view of a component feeder system according to a typical embodiment of the present invention.

Referring to FIG. 1, there is illustrated a chip component sorting and handling machine 20 which is configured in accordance with the teachings of the present invention. Machine 20 includes rotary index station 21, multiple track station 22, vibratory hopper 23, blank tape reel 24, heat-seal station 25 and components-loaded tape reel 26. Reel 24 provides the lower plastic layer and heat-seal station 25 provides the upper plastic layer which is sealed to the lower layer.

Figure 12:
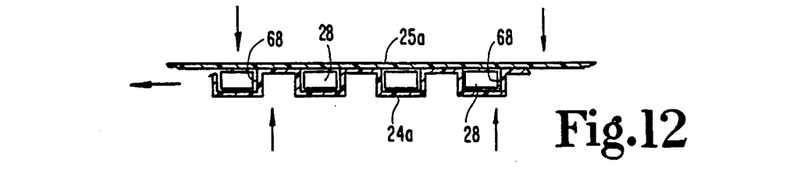
FIG. 12 is a partial, diagrammatic front elevation view in full section illustrating component loading into a plastic strip according to the present invention.

Reel 24 includes a continuous length 24a of clear plastic material which is formed with small, generally rectangular-solid depressions (see FIG. 12). These depressions are sized and shaped to correspond to the size and shape of the chip component to be loaded therein. The top cover panel or closing strip 25a is introduced to the assembly after the individual chip components are loaded into their corresponding depressions. This top cover strip is a substantially flat, generally rectangular piece of clear plastic which is applied over the components loaded into the depressions and sealed to the lower clear plastic strip so as to completely encase these components within their depressions. The top strip may be sealed to the lower strip by either heat or adhesive and the sealed and encased tape strip with the loaded chip components is then wound up on reel 25 for ultimate use by the printed circuit board manufacturer. This component-loaded reel is used as part of the manufacturer's automated assembly process where these loaded chips (ceramic capacitors) are surface mounted onto the printed circuit board. The lower strip of tape 24a may be formed with an outer lip or flange containing perforations so as to interface with a sprocket drive at the assembly location for the circuit boards.

As is believed to be well-known in the art, a large supply of clear plastic tape 24a is loaded onto reel 24 which is mounted on a rotary hub so that the tape 24a can be easily unwound as needed. A drive motor is connected to the rotary hub for controlling the unwinding and dispensing of tape 24a. Pivot arm 24b is hinged and freely floats as tape is unwound and used by machine 20. Position sensors are disposed relative to pivot arm 24b which control the operation of the drive motor. As the machine uses tape 24a, the pivot arm 24b moves upwardly toward a horizontal orientation where a first sensor is tripped. This sensor activates the motor which unwinds more tape. As more tape is unwound, the tension lessens and the pivot arm hingedly moves in a downward, clockwise direction until another sensor is tripped causing the motor to halt the unwinding action. Without motorized control to the unwinding action of the reel, too much tape could come off of the reel 24. This on-off cycle of the motor repeats as the pivot arm travels up and down between the two sensors. After the chip components are loaded into the lower plastic layer (tape 24a), the covering layer 25a of clear plastic tape is dispensed by station 25 and is sealed over the components.

The encased component strip 26a feeds across pivot arm 26b which lowers in a hinged, counterclockwise direction in response to an increased amount of tape feeding across. When the pivot arm 26b reaches a predetermined position a first sensor is tripped which energizes the drive motor attached to the hub of reel 26. The motor winds up the tape 26a onto reel 26 until the pivot arm becomes almost horizontal at which point a second sensor is tripped stopping the windup of reel 26. This on-off cycle of the motor repeats as the pivot arm travels up and down between the two sensors.

Due to the complexity of the drawings which would result if every detail was illustrated, a number of the drawings are diagrammatic in nature with several minor and inconsequential aspects omitted for clarity. The omitted details pertain to features of the equipment which are believed to be well known and readily available as off-the-shelf purchased items. Further, any features omitted are either not critical in the sense of novelty or unnecessary in the sense of a complete and adequate description. For example, such items as vacuum pickup devices are believed to be well known and since the design of such equipment is neither pertinent to the novelty of this invention nor necessary for a complete and thorough understanding of the invention, the details of such items have been omitted.

The chip components, such as ceramic capacitors, which are to be sorted, handled and ultimately loaded into plastic strips by machine 20 are initially randomly loaded into hopper 23 which provides a dispensing means for these components and provides both storage and delivery functions. The location of hopper 23 represents the start of the entire sorting, handling and loading procedure which is the subject of this invention. The chip components which are randomly loaded into hopper 23 are subjected to vibratory action by means of a linear vibrator. The bottom surface of the hopper is a plate containing receiving channels for the components. This plate extends beyond the front open face 41 of the hopper. The randomly moving and orientating chip components are delivered into and in some cases onto twenty-five generally rectangular (in lateral section) and substantially parallel receiving channels 27 which are disposed in the plate 27a (see FIG. 2A) which constitutes the floor of the hopper. These channels have the appearance of parallel machined slots in a rectangular block of metal. These generally rectangular receiving channels 27 are tightly grouped in a side-by-side arrangement in plate 27a as shown in FIG. 2A. FIG. 2A is merely a diagrammatic representation of how the hopper feeds into the twenty-five channels. The surrounding housing and hardware of FIG. 2 have been omitted for drawing clarity.

Figure 4A:
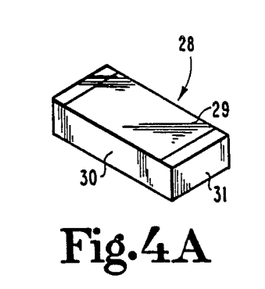
FIGS. 4A, 4B and 4C are perspective views of a generally rectangular solid chip component.
Figure 4B:
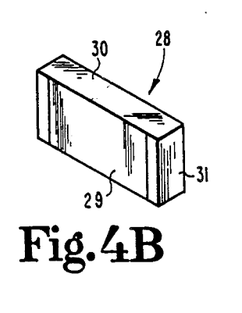
Figure 4C:
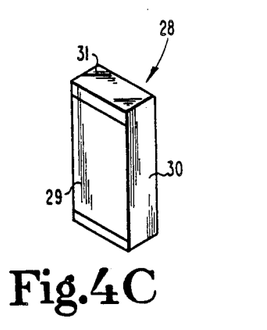

The chip components 28 which are used with the present invention are configured as generally rectangular solids (see FIG. 4). Consequently, each chip component 28 has a length dimension, a width dimension and a thickness dimension. In this six-sided rectangular solid, there are two length/width surfaces 29, two length/thickness surfaces 30 and two width/thicknesses surfaces 31.

Figures 10, 11:
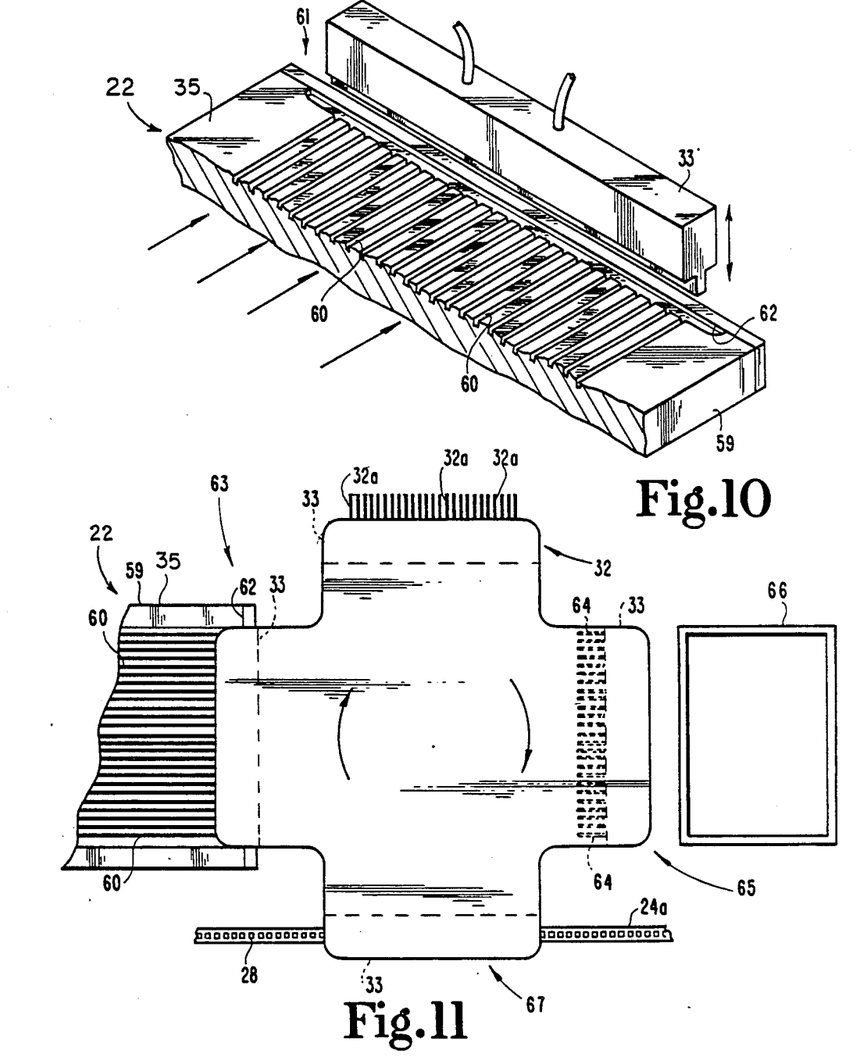
FIG. 10 is a partial, diagrammatic perspective illustration of a vacuum pickup head at the end of the multiple-track station.
FIG. 11 is a partial, diagrammatic top plan view of a rotary index station comprising a portion of the FIG. 1 system.

Rotary index station 21 is named for the nature or direction of its movement and includes four positions, each one having a different function. Greater details of the rotary index station 21 are illustrated in FIGS. 10 and 11, and as will be described in greater detail with reference to those figures, one key feature of the present invention is the increased speed of loading the chip components into the formed depressions in the lower plastic strip 24a of tape. By ganging together several generally rectangular channels 27 (25 total in the preferred embodiment) and by processing twenty-five chip components at a time throughout the sorting, handling and loading procedures, the present invention will enable almost 90,000 chip components per hour to be loaded into the clear plastic tape.

While twenty-five chip components at a time is important for processing speed, it is also important not to have any voids in the depressions of the clear plastic tape. The component-loaded tape 26a is going to be used in an automated production line, possibly as one tape reel for one style of component along with many other tape reels for different components. If one of the formed depressions is empty, then when that empty depression is cycled into position for withdrawal of the component and insertion of that missing component into or onto the printed circuit board, there will not be a component to select. The problem which then results is that the automated board assembly either stops, if the system has appropriate sensors and interlocks or will continue on with the installation of other components ultimately resulting in a defective board. Consequently, it is essential that each and every formed depression in the clear plastic strip be loaded with an electrically tested and operable chip component.

With regard to the selection of twenty-five substantially parallel tracks or channels for arranging twenty-five chip components in a plurality of side-by-side rows, it should be understood that a fewer number of parallel channels would reduce the speed of the loading operation and a larger number of channels would result in two potential problems. The first potential problem is just the increased size of the vacuum head pickup which is part of rotary index station 21. There is a limit as to the number of chip components which can be simultaneously picked up by means of a single vacuum head and thereafter safely moved, handled and processed. Although such vacuum pickup means can be very precise as to the exact location, both as to the pickup of the components and the depositing of those components in the formed depressions in the plastic tape strip, the larger the number of components, the greater the margin for error. However, a more significant concern with regard to the number of chip components which are handled at one time involves the electrical testing which is conducted at rotary index station 21. As mentioned above, the chip components which are loaded into the plastic tape strip must be electrically "good" and there must not be any voids in the depressions of the tape 26a. Consequently, once the 25 chip components are picked up from the end of the multiple track station 22 (see FIG. 11), these 25 chip components are moved to an electrical test position 32. Each chip is individually tested by 25 separate pairs of probes, represented by wires 32a which correspond to the twenty-five chip locations in the vacuum pickup head 33. If any one of the 25 chip components is defective and does not meet the electrical test requirements, that chip component must be discarded and the remaining chip components which did test as being acceptable recycled back to hopper 23. This good/bad component sorting occurs at another location on the rotary index station 21 and is the means to insure that voids (absence of a component) do not exist in the depressions of the finished tape strip. However, each time one or more of the 25 chip components which are being handled simultaneously is defective, that cycle time is lost thereby reducing the overall speed as to the number of components which can be loaded per hour. As the number of chip components being handled simultaneously increases, the probability of at least one defective chip component also increases. Consequently, the selection of 25 chip components to be handled simultaneously from the 25 substantially parallel tracks or channels is a compromise to try and achieve the greatest speed possible without reducing that speed due to the presence of defective components.

As will be described hereinafter in greater detail with regard to rotary index station 21, there are four positions or locations beginning with the pickup of the 25 chip components at the end of the multiple-track station 22 (see FIG. 10). We have already indicated the problem if one or more of the 25 components are not acceptable electrically, but if all 25 are acceptable, they are rotated to the final position of this four-position rotation for loading into the formed depressions of the plastic strip, and this loading occurs 25 components at a time. As mentioned, if any of the 25 components are not acceptable, based on the electrical tests which are performed, the group of twenty-five components cannot be loaded into the formed depressions in the tape. When the twenty-five components are indexed to the third position which is intermediate between the final loading and the electrical test, the good parts are recycled and the defective parts are discarded. When there is a determination made that at least one of the group of 25 chip components is defective electrically, the plastic tape 24a will not advance or travel any further and will stop at that point until a new and complete grouping of 25 chip components all test good electrically so that they can be advanced to the formed depressions without having any depressions empty and thereby insuring that all loaded chip components are good electrically and that there is a continuous series in the sealed plastic tape.

Having generally described the overall operation of machine 20, the specific features will now be described with reference to FIGS. 2–12.

Figure 2:
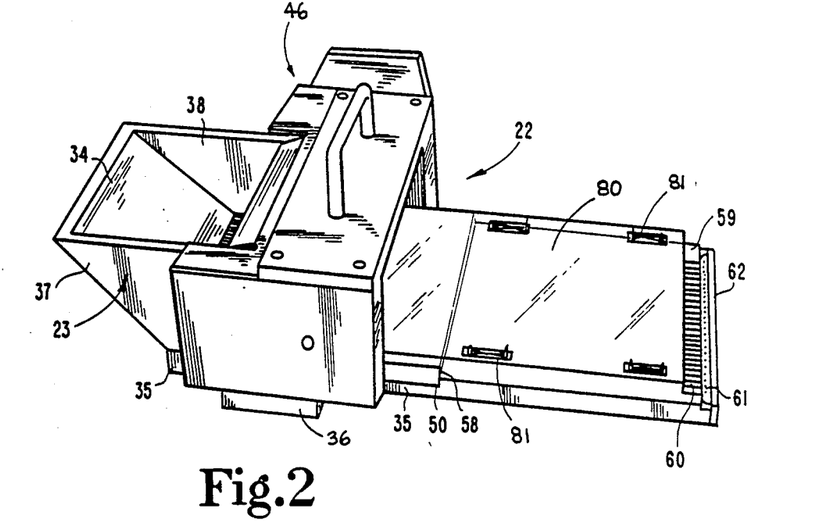
FIG. 2 is a perspective view of a multiple-track station 22 which comprises a portion of the FIG. 1 system.
Figure 2A:
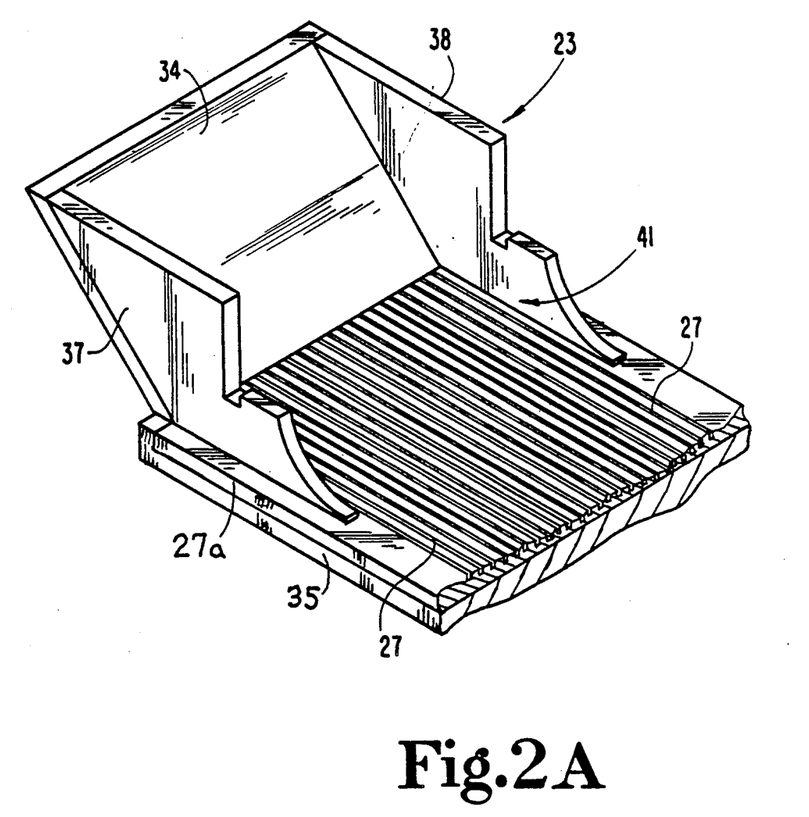
FIG. 2A is a partial, perspective view of a hopper and channels comprising a portion of the FIG. 2 multiple-track station.
Figure 3:
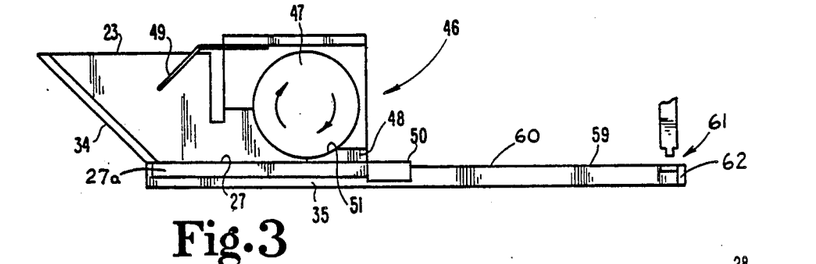
FIG. 3 is a diagrammatic, front elevational view of the multiple-track station of FIG. 2.

Referring to FIGS. 2, 2A and 3, there is illustrated in greater detail the arrangement of vibratory hopper 23 and multiple-track station 22. Hopper 23 includes a generally inclined feed surface 34 which is inclined above horizontal. It is onto this surface that randomly oriented chip components 28 are placed. Surface 34 extends directly into contact with the twenty-five parallel channels 27. Linear vibrator 36 is disposed beneath base 35 and provides vibratory motion to base 35, plate 27a and to hopper 23 so as to gently shake the chip components, randomly varying their orientation in an attempt to have them properly orient themselves for feeding into the twenty-five parallel channels. Sides 37 and 38 enclose feed surface 34 so as to help retain the components which are loaded into the hopper. The open front 41 of hopper 23 allows the components to empty directly onto and into the rectangular channels 27 of plate 27a without restriction. However, to limit advancement of components to a single properly oriented layer in the channels other means are employed.

Figure 7:
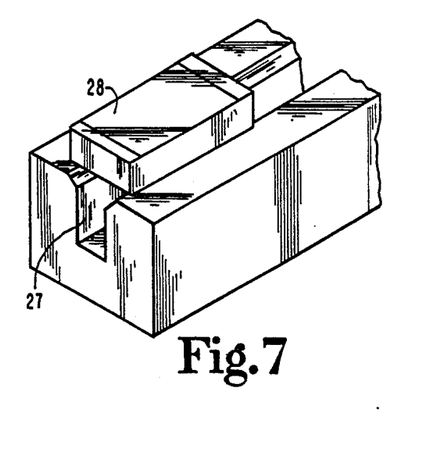
FIG. 7 is a partial, perspective view of a FIG. 5 channel and a FIG. 4 component.
Figure 8:
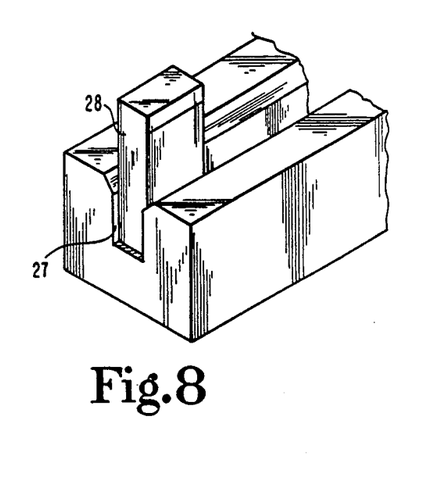
FIG. 8 is a partial, perspective view of a FIG. 5 channel with a FIG. 4 component loaded therein.

As should be understood by reference to FIGS. 4-8, each chip component 28 is able to orient itself in any one of three different orientations. When sitting on its largest flat side (surface 29) as illustrated in FIG. 4A, the width dimension is too great to fit within channel 27 (see FIG. 7). The result is that the channel remains open to receive a chip component which is properly oriented. If the component feeds from the hopper 23 into the channel 27 (any of the one twenty-five parallel channels) in a "standing-on-end" orientation as shown in FIG. 4C, then it will fit within the channel but it will extend too high above the channel as is illustrated in FIG. 8. The final option for the orientation of the chip components is that orientation which is illustrated in FIG. 4B and in FIG. 6.

Figures 5, 6:
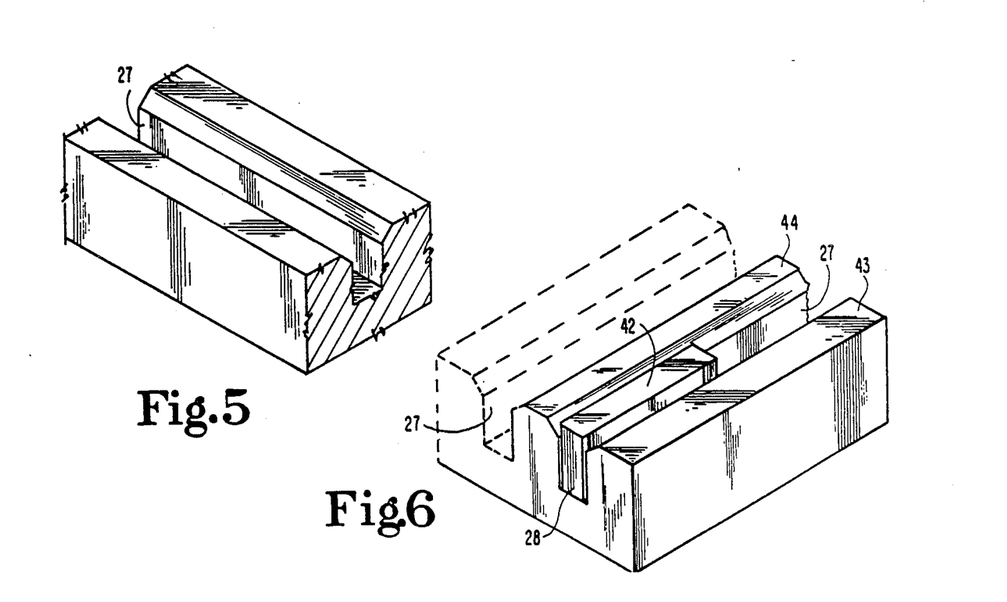
FIG. 5 is a partial, perspective view of one channel of the FIG. 2A multiple channels.
FIG. 6 is a partial, perspective view of two channels with a FIG. 4 component loaded therein.

The manner in which chip component 28 properly fits within channel 27 is that oriented in FIG. 4B and is such that the top surface 42 of the chip component is flushed to slightly recessed below the top edges 43 and 44 of the channel 27. It is desired to orient the chip components in the manner of FIG. 6 throughout the entire length of each channel 27. This particular orientation is important in view of a 90-degree turn which is introduced to the chip components as part of the multiple-track station 22 such that the finishing orientation on the chip components is the orientation desired for the loading of the chip components into the depressions of the plastic tape strip. Consequently, any chip component which moves from the hopper either on or via channels 27 through the open front 41 and which is in the orientation of FIG. 7 or FIG. 8 must be removed or reoriented so as to achieve the only acceptable orientation which is that illustrated in FIG. 6. FIG. 5 depicts the elongate nature of each rectangular channel 27 and FIG. 6 depicts the configuration of two side-by-side channels. The full length and the side-by-side orientation of the full set of twenty-five parallel channels is illustrated in FIGS. 2A, 10 and 11. FIG. 2 also illustrates a brush-back structure 46 which is employed to reorient the chip components by sweeping away or flipping back any component which feeds into the various channels 27 in either a FIG. 7 or FIG. 8 orientation.

By means of a 90-degree turn to the component along an axis in the longitudinal direction of the channel, the orientation of any chip component as in FIG. 8 can be changed from that orientation to the acceptable orientation of FIG. 6. Thus all that has to be done is to tap or brush the upwardly extending portion of the chip component so that it pivots backward in the longitudinal direction of the channel, so that it can properly orient itself, assuming that there is space to do so. In order for any component oriented as in FIG. 7 to be "recycled" so that it can try again to orient itself into the form of FIG. 6, it needs to be removed from the top of the twenty-five channels. Brush-back structure 46 performs this function. Structure 46 includes generally cylindrical brush roller 47, guide 48, and deflector panel 49. It is also to be understood that the orientation of FIG. 7 is illustrative of only one of several improper orientations. Any chip component, either in a single layer or double layers or randomly skewed at any angle which are disposed on top of the twenty-five channels 27, must be swept clean and brushed back into an open area of the hopper or an open area of the channels.

Brush roller 47 is positioned such that a tangent line drawn to its lowermost point is nearly co-planar with the top of the channels 27 (i.e., plate 27a) disposed on base 35. The roller is rotated in a clockwise direction (with reference to FIG. 3) and skims the top of the channel side walls so as to brush back any chip components resting on top and being advanced toward the roller either by direct vibratory motion or indirectly by riding on top of other chip components disposed in the various parallel channels 27.

Guide 48 is disposed over a portion of plate 27a and is in effect a cover over channels 27 which extend beneath guide 48. All chip components which are properly aligned and oriented in their respective channels 27 will advance beneath guide 48 and on into roll-over insert 50 which comprises part of multiple-track station 22. The lower, front lip of guide 48 is shaped like a plow and this lip serves as an abutment to stop the advance of any chip components which are not properly oriented.

Another function of the guide 48 is to provide a backup to the brush roller 47 and as such extends from beneath the roller, up the back side with a front surface 51 curvature that is virtually identical to the cylindrical curvature of the roller. In other words, the curvature of front surface 51 matches the circumferential contour of the roller. Any chip components not properly oriented in one of the 25 substantially parallel channels 27 which might somehow pass over the lower, front lip of guide 48 and pass between the brush roller and the guide are all forced up along the curved surface 51 where the brush roller keeps sweeping that surface and pulling any such components back down toward the channels.

Any chip components which ride on top of plate 27a and are not properly oriented may be flipped back in the direction of the hopper 23 by brush roller 47. Any components remaining on top of plate 27a have the chance of achieving a proper orientation as the linear vibrator continues to gently shake plates 35 and 27a. Any components which become airborne will strike deflector panel 49 which is set at the appropriate angle for deflecting such chip components back into hopper 23.

Rollover insert 50 is disposed over plate 35 and abuts up against plate 27a near the edge of guide 48. Insert 50 is configured with a series of twenty-five channels 57 which are aligned with channels 27 in plate 27a. The properly oriented chip components in channels 27 will pass directly into the corresponding and aligned channels 57. At the distal end of rollover insert 50 plate 35 is configured with an increased thickness as it steps up from the lower notch beneath insert 50. This thicker section 59 of plate 35 is configured with twenty-five channels 60 which are aligned with the channels 57 of insert 50 as those channels exit from insert 50.

The result of the combination of channels 27 in plate 27a, channels 57 in roll-over insert 50 and channels 60 in section 59, all of which are part of the multiple-track station 22, is to create a series of twenty-five substantially parallel tracks connecting the interior of hopper 23 with the distal end of plate 35. This structure means that all components which ultimately get oriented properly in channels 27 will index themselves automatically through the roll-over insert and on to the end of plate 35. Each additional component entering a channel 27 pushes the other components in that channel forward. A slight downward incline to these parallel tracks facilitates the vibratory advancement. Ultimately there will be a continuous series of chip components arranged in proper orientation end-to-end (in the FIG. 6 orientation) in each of the twenty-five generally rectangular, substantially parallel tracks.

The distal end 61 of plate 35 (section 59) is blocked by an appropriate end wall 62 such that the advancing chip components feed continuously up to that point. In time the entire length of each channel and groove from open front 41 of the hopper to end 61 is filled with properly oriented chip components. Additional components from hopper 23 are unable to feed into the channels until a row of components contiguous to end 61 are lifted at position 63 of rotary index station 21 and removed from the twenty-five parallel channels 60 by vacuum pickup head 33. The vacuum pickup head 33 simultaneously picks up one row of chip components, twenty-five in all, one from each of the twenty-five channels. The components which are picked up by the vacuum head are those positioned adjacent end 61.

It is important to note at this point that the rectangular solid shape of each component 28 is such that it may orient itself randomly in any one of the three positions as previously described. However there is, as experience has shown, a most likely orientation which will occur as a result of random vibratory motion. This most likely orientation is that illustrated in FIG. 4B and also as shown as received in the channel 27 in FIG. 6. This is why the rectangular channels 27 are configured with their specific width and height dimensions that match the most likely orientation for the chip components. Obviously, if the chip components had a tendency to orient themselves in a different fashion, the channels would be dimensioned and configured correspondingly.

Figure 9:
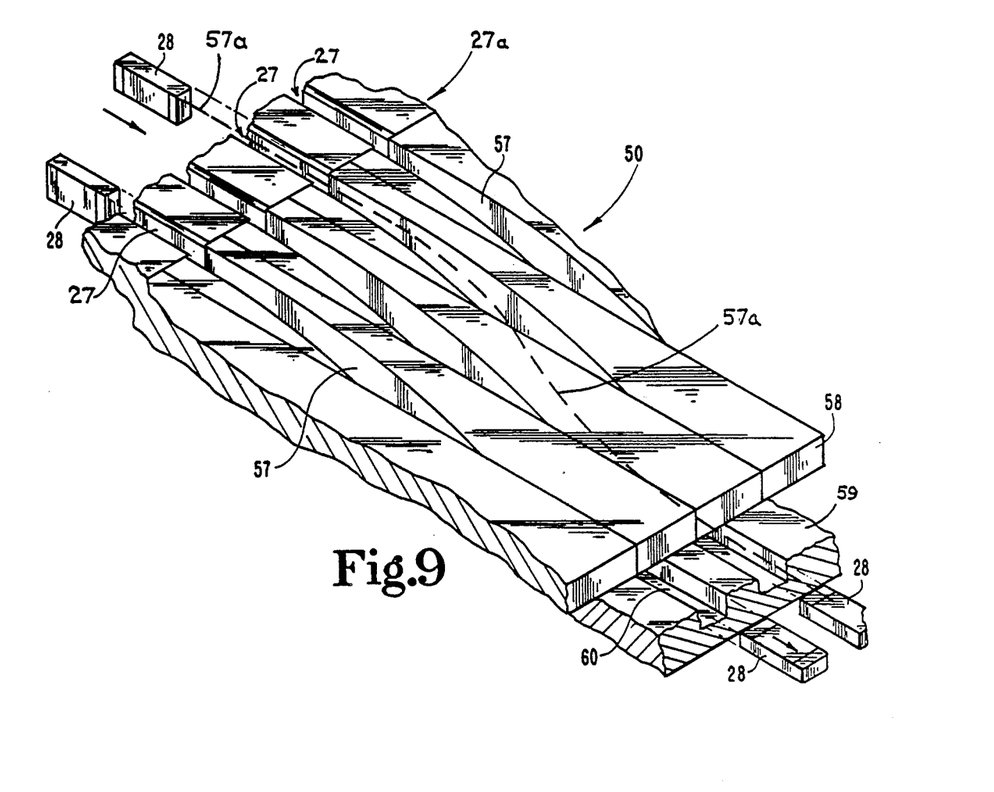
FIG. 9 is a partial, perspective view of a roll-over insert comprising a portion of the FIG. 1 system.

It should also be noted though that the final orientation for these components, as they will be surface-mounted on the printed circuit boards, is the orientation of FIG. 4A. Since this is not the orientation of the chip components as they are loaded into the channels 27, a 90-degree turn must be introduced to these components at some point in its travel to end 61. This 90-degree turn takes place within roll-over insert 50 (as shown in FIG. 9). Components enter the twenty-five substantially parallel channels 57 of roll-over insert 50 in the orientation of FIG. 4B and leave in the orientation of FIG. 4A. The travel of one chip component is traced by broken line 57a.

What has been described as substantially parallel channels 57 of roll-over insert 50 are actually a side-by-side series of twenty-five spiral or helix grooves 57 which are identically shaped and contoured. The specific shape of each channel can be thought of as having a generally uniform spiral twist changing the component orientation by 90 degrees. The lateral cross-sectional shape of each channel of this group at any point along its length is generally rectangular. In order to help visualize this helix or spiral shape, it is helpful to think of each channel 57 of the roll-over insert 50 as beginning as a substantially straight, generally rectangular channel held horizontally at each end and then with one end remaining fixed, rotate the other end 90 degrees, still maintaining the horizontal configuration. As will be clear from that example, as the chip components exit the roll-over insert, they will be turned on their large flat side surface and thus the channels 60 which are provided in the thicker section 59 of plate 35 are wider than the channels 27 in plate 27a. It is insert 50 which provides the transition from channels 27 to channels 60. As the components are moved, still by vibratory action and by the pushing action of upstream components, the twenty-five channels 60 of section 59 provide row after row of twenty-five components laid on their larger flat side surface 29 which is the side required for both electrical testing and loading into the formed depressions in the plastic tape 24a.

At rotary index station 21 there are four positions and these are diagrammatically illustrated by the four rectangular blocks marked as reference numeral 33. These blocks are representative of the position of the vacuum pickup head as it moves from location to location carrying the twenty-five chip components. The starting point is position 63 where the components are lifted up out of the 25 channels 60.

One variation to the design of end wall 62 is to provide twenty-five vacuum line openings, one each corresponding to each channel 60. If suction is applied to these openings it will tend to hold each component in place (the first or end component in each channel). When the vacuum pickup head is lowered to retrieve the components, the suction force is briefly interrupted and then resumed for the next row of chip components.

At electrical test position 32 each component is electrically tested. Wires 32a correspond to each chip location and if any component fails the electrical test, a signal is sent to a corresponding air jet 64, at position 65, of which there are 25 in one-to-one correlation with each wire 32a and each component position in the vacuum head 33.

After the electrical test at position 32, the vacuum head 33 moves to position 65. If one or more chip components have failed the electrical test at station 32, these must be removed. At station 65 any defective component is ejected from head 33 by the corresponding air jet 64. Any defective component is ejected into bin 66 by the air jet(s) and the remaining components are deposited in another bin by simply releasing the vacuum in head 33 and allowing the "good" components to fall into the bin. The vacuum head 33 then moves through position 67 without depositing any components into the tape strip and thereafter returns to position 63 and starts again to try and have all twenty-five components pass the electrical test.

If all twenty-five components test "good," the head 33 rotates through position 65 without ejecting any components and goes on to loading position 67. At position 67, the vacuum head lowers into position over tape layer 24a and releases the vacuum so that the components are loaded into depressions 68 (see FIG. 12), and thereafter the top tape layer is sealed in place and the tape wound up on reel 26. It is to be understood that the rotary action of the vacuum head cycles through each position with one direction of rotation. What occurs at positions 65 and 67 depends upon what occurred at position 32.

Finally, as one illustrated option, a clear plastic cover 80 may be placed over insert 50 and section 59 as a means of preventing particulate contaminants from getting into the tracks. This cover 80 is illustrated in FIG. 2 and includes four quick-release clips 81 which hold the cover in place on top of section 59.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A chip component handling and loading system for orienting and transporting a plurality of generally rectangular solid chip components, said system comprising:
   dispensing means for storing and delivering a plurality of randomly oriented chip components;
   a plurality of substantially parallel component conveying tracks disposed in cooperating communication with said dispensing means;
   a roll-over insert for changing the orientation of a plurality of generally rectangular solid chip components, each chip component having different length, width and thickness dimensions, said roll-over insert including (a) a plurality of entry ports arranged side by side and each being sized with a side-to-side width dimension corresponding to the thickness dimension of said chip components such that said entry port is only able to receive a corresponding chip component when it is oriented on its edge such that its side-to-side dimension is the thickness dimension and such that said entry port rejects any chip component which is oriented such that the side-to-side dimension of said chip component is either the length or width dimension of said chip component, (b) a plurality of exit ports arranged side by side and each being sized to a width dimension so as to receive the width dimension of the corresponding chip component and (c) a plurality of longitudinal channels, each having a longitudinal axis, connecting each entry port with its corresponding exit port, each channel configured with a helical twist about said longitudinal axis for turning the entering chip component approximately 90 degrees prior to leaving the exit port; and pick and place means for concurrently transferring a plurality of chip components from said plurality of exit ports to a different location.

2. The chip component handling and loading system of claim 1 wherein said dispensing means includes a vibratory hopper open at the base and disposed atop one end of said plurality of substantially parallel component conveying tracks.

3. The chip component handling and loading system of claim 2 which further includes brush-back means for assisting in the proper orientation of the chip components into said plurality of substantially parallel component conveying tracks.

4. The chip component handling and loading system of claim 3 wherein said brush-back means includes a brush roller disposed over and extending laterally across a portion of said substantially parallel component conveying tracks.

5. The chip component handling and loading system of claim 4 wherein said brush-back means further includes a deflector panel disposed over a portion of said vibratory hopper and arranged to deflect brushed-back airborne chip components into said vibratory hopper.

6. The chip component handling and loading system of claim 5 wherein said plurality of substantially parallel component conveying tracks includes a total of twenty-five such conveying tracks.

7. The chip component handling and loading system of claim 6 wherein said roll-over insert is disposed between said dispensing means and said pick and place means.

8. The chip component handling and loading system of claim 7 wherein said pick and place means includes a four-position rotary index station having positions for pickup, electrical test, sorting and loading.

9. The chip component handling and loading system of claim 8 wherein said pick and place means further includes a vacuum head for pickup of the chip components.

10. The chip component handling and loading system of claim 1 which further includes brush-back means for assisting in the proper orientation of the chip components into said plurality of substantially parallel component conveying tracks.

11. The chip component handling and loading system of claim 10 wherein said brush-back means includes a brush roller disposed over and extending laterally across a portion of said substantially parallel component conveying tracks.

12. The chip component handling and loading system of claim 1 wherein said plurality of substantially parallel component conveying tracks includes a total of 25 such conveying tracks.

13. The chip component handling and loading system of claim 1 wherein said roll-over insert is disposed between said dispensing means and said pick and place means.

14. The chip component handling and loading system of claim 1 wherein said pick and place means includes a four-position rotary index station having positions for pickup, electrical test, sorting and loading.

15. The chip component handling and loading system of claim 14 wherein said dispensing means includes a vibratory hopper open at the base and disposed atop one end of said plurality of substantially parallel component conveying tracks.

16. The chip component handling and loading system of claim 14 wherein said pick and place means further includes a vacuum head for pickup of the chip components.

17. The chip component handling and loading system of claim 1 which further includes brush-back means for assisting in the proper orientation of the chip components into said plurality of substantially parallel component conveying tracks, and wherein said dispensing means includes a vibratory hopper open at the base and disposed atop one end of said plurality of substantially parallel component conveying tracks, and wherein said pick and place means includes a four-position rotary index station having positions for pickup, electrical test, sorting and loading.

18. A chip component handling and loading system for orienting and transporting a plurality of generally rectangular solid chip components, said system comprising:

dispensing means for storing and delivering a plurality of randomly oriented chip components;

a plurality of substantially parallel component conveying tracks disposed in cooperating communication with said dispensing means;

a roll-over insert for changing the orientation of a plurality of generally rectangular solid chip components, each chip component having different length, width and thickness dimensions, said roll-over insert including (a) a plurality of entry ports arranged side by side and each being sized with a side-to-side width dimension corresponding to the thickness dimension of said chip components such that said entry port is only able to receive a corresponding chip component when it is oriented on its edge such that its side-to-side dimension is the thickness dimension and such that said entry port rejects any chip component which is oriented such that the side-to-side dimension of said chip component is either the length or width dimension of said chip component, (b) a plurality of exit ports arranged side by side and each being sized to a width dimension so as to receive the width dimension of the corresponding chip component and (c) a plurality of longitudinal channels, each having a longitudinal axis, connecting each entry port with its corresponding exit port, each channel configured with a helical twist about said longitudinal axis for turning the entering chip component approximately 90 degrees prior to leaving the exit port; and transfer means for moving a plurality of chip components from said exit ports to a different location.

19. A roll-over insert for changing the orientation of a plurality of generally rectangular solid chip components, each chip component having different length, width and thickness dimensions, said roll-over insert comprising:
- a plurality of entry ports arranged side by side and each being sized with a side-to-side width dimension corresponding to the thickness dimension of said chip components such that said entry port is only able to receive a corresponding chip component when it is oriented on its edge such that its side-to-side dimension is the thickness dimension and such that said entry port rejects any chip component which is oriented such that the side-to-side dimension of said chip component is either the length or width dimension of said chip component;
- a plurality of exit ports arranged side by side and each being sized to a width dimension so as to receive the width dimension of the corresponding chip component; and
- a plurality of longitudinal channels, each having a longitudinal axis, connecting each entry port with its corresponding exit port, each channel configured with a helical twist about said longitudinal axis for turning the entering chip component approximately 90 degrees prior to leaving the exit port.

20. The roll-over insert of claim 19 wherein the number of entry ports, the number of exit ports and the number of channels connecting the entry and exit ports all number the same and all are at least twenty in number.

* * * * *